(12) United States Patent
Park et al.

(10) Patent No.: US 8,179,179 B2
(45) Date of Patent: May 15, 2012

(54) SEMICONDUCTOR DEVICE

(75) Inventors: Min-Su Park, Gyeonggi-do (KR); Hoon Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 64 days.

(21) Appl. No.: 12/881,541

(22) Filed: Sep. 14, 2010

(65) Prior Publication Data

US 2012/0007639 A1    Jan. 12, 2012

(30) Foreign Application Priority Data

Jul. 6, 2010    (KR) .......................... 10-2010-0064902

(51) Int. Cl.
*H03H 11/16*    (2006.01)
(52) U.S. Cl. .......................... 327/231; 327/234; 327/355
(58) Field of Classification Search .......... 327/231–234, 327/355, 360–361, 295–297
See application file for complete search history.

(56) References Cited

U.S. PATENT DOCUMENTS 5,883,529 A * 3/1999 Kumata et al. .................. 326/93
7,928,790 B2 * 4/2011 Szczypinski .................. 327/261

FOREIGN PATENT DOCUMENTS

KR    102010042388    4/2010

OTHER PUBLICATIONS

Notice of Preliminary Rejection issued from Korean Intellectual Property Office on Oct. 31, 2011.

* cited by examiner

*Primary Examiner* — An Luu
(74) *Attorney, Agent, or Firm* — IP & T Group LLP

(57) ABSTRACT

A semiconductor device includes a reset signal generator configured to change the number of activated signals among a plurality of reset signals according to a frequency of an external clock, a plurality of mixing control signal generators configured to generate a plurality of first and second mixing control signals, and a clock mixer configured to generate a mixing clock by mixing a first driving clock and a second driving clock, wherein the first driving clock is generated by driving a positive clock of the external clock according to the plurality of first mixing control signals, and the second driving clock is generated by driving a negative clock of the external clock according to the plurality of second mixing control signals.

15 Claims, 5 Drawing Sheets

SEMICONDUCTOR DEVICE

CROSS-REFERENCE TO RELATED APPLICATIONS

The present application claims priority of Korean Patent Application No. 10-2010-0064902, filed on Jul. 6, 2010, which is incorporated herein by reference in its entirety.

BACKGROUND OF THE INVENTION

Exemplary embodiments of the present invention relate to a semiconductor design technology, and more particularly, to a clock mixing circuit of a semiconductor device.

A synchronous semiconductor memory device such as a double data rate synchronous dynamic random access memory (DDR SDRAM) is designed to transfer data to external devices by using an internal clock synchronized with an external clock inputted from an external device, such as a memory controller (CTRL).

In order to stably transfer data between a memory device and a memory controller, a temporal synchronization between an external clock applied from the memory controller and data outputted from the memory device is very important.

The memory device outputs data in synchronization with an internal clock. The internal clock is synchronized with the external clock when it is initially applied to the memory device, but the internal clock is delayed while passing through elements within the memory device. Thus, the data is outputted to the outside of the memory device in such a state that it may not be synchronized with the external clock.

In order to stably transfer data outputted from the memory device, the internal clock, delayed while passing through the elements within the memory device, must exactly match the edge or center of the external clock applied from the memory controller. To this end, the internal clock may be synchronized with the external clock by reversely compensating time for loading the data on a bus.

Examples of a clock synchronization circuit for playing such a role include a phase locked loop (PLL) circuit and a delay locked loop (DLL) circuit.

When frequencies of the external clock and the internal clock are different from each other, a PLL circuit is used because a frequency multiplication function is needed. On the other hand, when frequencies of the external clock and the internal clock are equal to each other, a DLL circuit is used because it is not greatly influenced by noise and can be implemented in a relatively small area, as compared to the PLL circuit.

Accordingly, since semiconductor memory devices commonly use the same frequency for both the external clock and the internal clock, the DLL circuit is widely used as the clock synchronization circuit.

In particular, a register controlled DLL circuit is widely used in semiconductor memory devices. The register controlled DLL circuit includes a register which may store a locking delay value. When the power is interrupted, the locking delay value is stored in the register. Then, when the power is again supplied, the locking delay value stored in the register is loaded and used to lock the internal clock. Thus, in the initial operation of the semiconductor memory device, a clock synchronization operation may be performed at a timing at which a phase difference between the internal clock and the external clock is relatively small. After the initial operation of the semiconductor memory device, time taken to synchronize the internal clock with the external clock may be reduced by adjusting the variation range of the delay value of the register according to the phase difference between the internal clock and the external clock.

FIG. 1 is a block diagram illustrating the configuration of a known register controlled DLL circuit.

Referring to FIG. 1, the known register controlled DLL circuit includes a clock buffering unit 100, a divider 180, a phase comparison unit 120, a clock delay unit 140, and a delay replica model unit 160. The clock buffering unit 100 is configured to buffer a positive source clock CLK and a negative source clock CLKB inputted from the outside. The divider 180 is configured to divide a frequency of a reference clock REFCLK corresponding to a clock edge of the positive source clock CLK according to a preset ratio, and output a division reference clock REFCLK_DIV. The phase comparison unit 120 is configured to compare a phase of the division reference clock REFCLK_DIV with a phase of a feedback clock FEEDBACK_CLK. The clock delay unit 140 is configured to delay a phase of a first internal clock RCLK corresponding to a clock edge of the positive source clock CLK, a phase of a second internal clock signal FCLK corresponding to a clock edge of the negative source clock CLKB, and a phase of the division reference clock REFCLK_DIV by a delay amount corresponding to an output signal PHASE_COMP of the phase comparison unit 120. The delay replica model unit 160 is configured to output the feedback clock FEEDBACK_CLK by reflecting an actual delay condition of the source clocks CLK and CLKB into an output clock REFCLK_DIV_DELAY of the clock delay unit 140 corresponding to the inputted division reference clock REFCLK_DIV.

The clock buffering unit 100 includes a positive clock buffer 102, a negative clock buffer 104, and a dummy clock buffer 106. The positive clock buffer 102 is configured to buffer the positive source clock CLK and output the first internal clock RCLK. The negative clock buffer 104 is configured to buffer the negative source clock CLKB and output the second internal clock FCLK. The dummy clock buffer 106 is configured to buffer the positive source clock CLK and output the reference clock REFCLK.

Also, the clock delay unit 140 includes a first delay section 142, a second delay section 144, a dummy delay section 146, and a delay control section 148. The first delay section 142 is configured to delay a phase of the first internal clock RCLK in response to a delay control signal DELAY_CON. The second delay section 144 is configured to delay a phase of the second internal clock FCLK in response to the delay control signal DELAY_CON. The dummy delay section 146 is configured to delay a phase of the division reference clock REFCLK_DIV_DELAY in response to the delay control signal DELAY_CON. The delay control section 148 is configured to change a logic level of the delay control signal DELAY_CON in response to the output signal PHASE_COMP of the phase comparison unit 120.

FIG. 2 is a block diagram illustrating a delay section of the clock delay unit in the known register controlled DLL circuit of FIG. 1.

Referring to FIG. 2, the delay sections 142, 144, and 146 of the clock delay unit 140 in the known register controlled DLL circuit each include a first delay line 200, a second delay line 220, and a is phase mixer 240. The first delay line 200 includes a plurality of delay units DU1, DU2, DU3, DU4, DU5, DU6, DU7 and DU8 coupled in series, and delays the first internal clock RCLK, the second internal clock FCLK, or the division reference clock REFCLK_DIV through an odd number of the delay units, which are in a preset order, in response to the delay control signal DELAY_CON. The second delay line 220 includes a plurality of delay units DU1, DU2, DU3, DU4, DU5, DU6, DU7 and DU8 coupled in series, and delays the first internal clock RCLK, the second internal clock FCLK, or the division reference clock REFCLK_DIV through an even number of the delay units, which are in a preset order, in response to the delay control signal DELAY_CON. The phase mixer 240 is configured to mix a phase of a clock DU_CLK_1 outputted from the first delay line 200 and a phase of a clock DU_CLK_2 outputted from the second delay line 220 at a ratio corresponding to the delay control signal DELAY_CON.

FIG. 3 is a block diagram illustrating a known phase mixer among the elements of the delay section of FIG. 2.

Referring to FIG. 3, the known phase mixer 240 of the delay sections 142, 144, and 146 of the clock delay unit 140 includes a plurality of mixing control signal generators 242<1>, 242<2>, 242<3>, ..., 242<N>, and a clock mixer 244. The plurality of mixing control signal generators 242<1>, 242<2>, 242<3>, ..., 242<N> are configured to generate a plurality of mixing control signals MIX_CON<1>, ..., MIX_CON<2>, MIX_CON<3>, ..., MIX_CON<N>, MIX_CONB<1>, MIX_CONB<2>, MIX_CONB<3>, ..., MIX_CONB<N> in response to mixing ratio control signals SHIFT_LEFT and SHIFT_RIGHT corresponding to the delay control signal DELAY_CON. The clock mixer 244 is configured to generate a mixing clock MIX_CLK by mixing a first driving clock DRV_DU_CLK_1 and a second driving clock DRV_DU_CLK_2. The first driving clock DRV_DU_CLK_1 is generated by driving the clock DU_CLK_1 outputted from the first delay line 200 according to the plurality of positive mixing control signals MIX_CON<1>, MIX_CON<2>, MIX_CON<3>, ..., MIX_CON<N>. The second driving clock DRV_DU_CLK_2 is generated by driving the clock DU_CLK_2 outputted from the second delay line 220 according to the plurality of negative mixing control signals MIX_CONB<1>, MIX_CONB<2>, MIX_CONB<3>, ..., MIX_CONB<N>.

The clock mixer 244 includes a plurality of first drivers 2442<1>, 2442<2>, 2442<3>, ..., 2442<N>, a plurality of second drivers 2444<1>, 2444<2>, 2444<3>, ..., 2444<N>, and a clock combiner 2446. The plurality of first drivers 2442<1>, 2442<2>, 2442<3>, ..., 2442<N> are configured to output the first driving clock DRV_DU_CLK_1 by driving and combining the clock DU_CLK_1 outputted from the first delay line 200 in response to the plurality of positive mixing control signals MIX_CON<1>, MIX_CON<2>, MIX_CON<3>, ..., MIX_CON<N>. The plurality of second drivers 2444<1>, 2444<2>, 2444<3>, ..., 2444<N> are configured to output the second driving clock DRV_DU_CLK_2 by driving and combining the clock DU_CLK_2 outputted from the second delay line 220 in response to the plurality of negative mixing control signals MIX_CONB<1>, MIX_CONB<2>, MIX_CONB<3>, ..., MIX_CONB<N>. The clock combiner 2446 is configured to output the mixing clock MIX_CLK by combining the first driving clock DRV_DU_CLK_1 and the second driving clock DRV_DU_CLK_2.

The operation of the known phase mixer 240 will be described by example below.

Here, it is assumed that each of the delay units DU1 to DU8 delay their respective inputs by a same delay unit amount. Referring to FIGS. 2 and 3, the phase of the clock DU_CLK_1 outputted from the first delay line 200 is in a state such that it is delayed by a delay amount of ½×delay unit amount corresponding to the position "1", and the phase of the clock DU_CLK_2 outputted from the second delay line 220 is in a state such that it is delayed by a delay amount of (1+½)×delay unit amount corresponding to the position "2".

If the ratio corresponding to the delay control signal DELAY_CON drives the clock DU_CLK_1 outputted from the first delay line 200 at 75% to generate the first driving clock DRV_DU_CLK_1, and drives the clock DU_CLK_2 outputted from the second delay line 220 at 25% to generate the second driving clock DRV_DU_CLK_2, the mixing clock MIX_CLK outputted from the clock combiner 2446 included in the phase mixer 240 is delayed by a delay amount of ¾×delay unit amount corresponding to a ¼×delay unit amount shift from position "1" in the direction of position "2" (see position "3" in FIG. 2).

On the other hand, if the ratio corresponding to the delay control signal DELAY_CON drives the clock DU_CLK_1 outputted from the first delay line 200 at 25% to generate the first driving clock DRV_DU_CLK_1, and drives the clock DU_CLK_2 outputted from the second delay line 220 at 75% to generate the second driving clock DRV_DU_CLK_2, the mixing clock MIX_CLK outputted from the clock combiner 2446 included in the phase mixer 240 is delayed by a delay amount of (1+¼)×delay unit amount corresponding to a ¾× delay unit amount shift from position "1" in the direction of position "2" (see position "4" in FIG. 2).

As described above, the phase mixer 240 may select a delay amount smaller than that of the delay unit and delay the clock. At this time, the phase mixer 240 can select the value of the delay amount and delay the clock by the selected delay amount according to the number of the first drivers 2442<1>, 2442<2>, 2442<3>, ..., 2442<N> and the number of the second drivers 2444<1>, 2444<2>, 2444<3>, ..., 2444<N>.

Meanwhile, when the frequencies of the positive source clock CLK and the negative source clock CLKB inputted from the outside are relatively high, it is advantageous when the delay amount selectable by the phase mixer 240 is relatively small.

On the other hand, when the frequencies of the positive source clock CLK and the negative source clock CLKB inputted from the outside are relatively low, it is advantageous when the delay amount selectable by the phase mixer 240 is relatively large.

However, in the known phase mixer 240, once the number of the first drivers 2442<1>, 2442<2>, 2442<3>, ..., 2442<N> and the number of the second drivers 2444<1>, 2444<2>, 2444<3>, ..., 2444<N> are determined, they cannot be changed.

Therefore, in case where the positive source clock CLK and the negative source clock CLKB having frequencies higher or lower than the frequencies determined when designed are applied to the semiconductor device, the performance of the DLL circuit may not be fully exhibited as expected at the time when it is designed.

For example, when the positive source clock CLK and the negative source clock CLKB having frequencies higher than the frequencies determined when designed are applied to the DLL circuit of the semiconductor device, considerable jitters may occur between the positive and negative source clocks CLK and CLKB applied from the outside and the positive and negative output clocks RCLK_DELAY and FCLK_DELAY of the clock delay unit 140, even though the operation of the DLL circuit is completed.

On the other hand, when the positive source clock CLK and the negative source clock CLKB having frequencies lower than the frequencies determined when designed are applied to the DLL circuit of the semiconductor device, much more time is taken to complete the operation of the DLL circuit than expected. Consequently, the operation of the DLL circuit may not be completed.

SUMMARY OF THE INVENTION

Exemplary embodiments of the present invention are directed to a semiconductor device which is capable of delaying source clocks (CLK and CLKB) by adjusting the delay amount variation range within the delay range narrower than the delay unit, when the frequencies of the source clocks (CLK and CLKB) applied to the semiconductor device are changed to be higher or lower than the frequencies determined when designed.

Exemplary embodiments of the present invention are further directed to a DLL circuit which is capable of performing a DLL operation at the maximum performance, without any problem, even when the frequencies of the source clocks (CLK and CLKB) are changed to be higher or lower than the frequencies determined when designed.

In accordance with an exemplary embodiment of the present invention, a semiconductor device includes a reset signal generator configured to change the number of activated signals among a plurality of reset signals according to a frequency of an external clock, a plurality of mixing control signal generation units configured to generate a plurality of first and second mixing control signals, wherein M number of the first and second mixing control signals corresponding to the activated signals among the plurality of reset signals have opposite levels, and R number of the first and second mixing control signals corresponding to deactivated signals among the plurality of reset signals have the same level, and a clock mixer configured to generate a mixing clock by mixing a first driving clock and a second driving clock, wherein the first driving clock is generated by driving a positive clock of the external clock according to the plurality of first mixing control signals, and the second driving clock is generated by driving a negative clock of the external clock according to the plurality of second mixing control signals.

In accordance with another exemplary embodiment of the present invention, a semiconductor device includes a plurality of first clock driving units configured to output a first driving clock by driving and combining a positive clock of an external clock, the first clock driving units being turned on/off according to a frequency of the external clock and having different driving powers, a plurality of second clock driving units configured to output a second driving clock by driving and combining a negative clock of the external clock, the second clock driving units being turned on/off according to the frequency of the external clock and having different driving powers, and a clock combiner configured to generate a mixing clock by combining the first driving clock and the second driving clock.

DESCRIPTION OF SPECIFIC EMBODIMENTS

Figure 1:
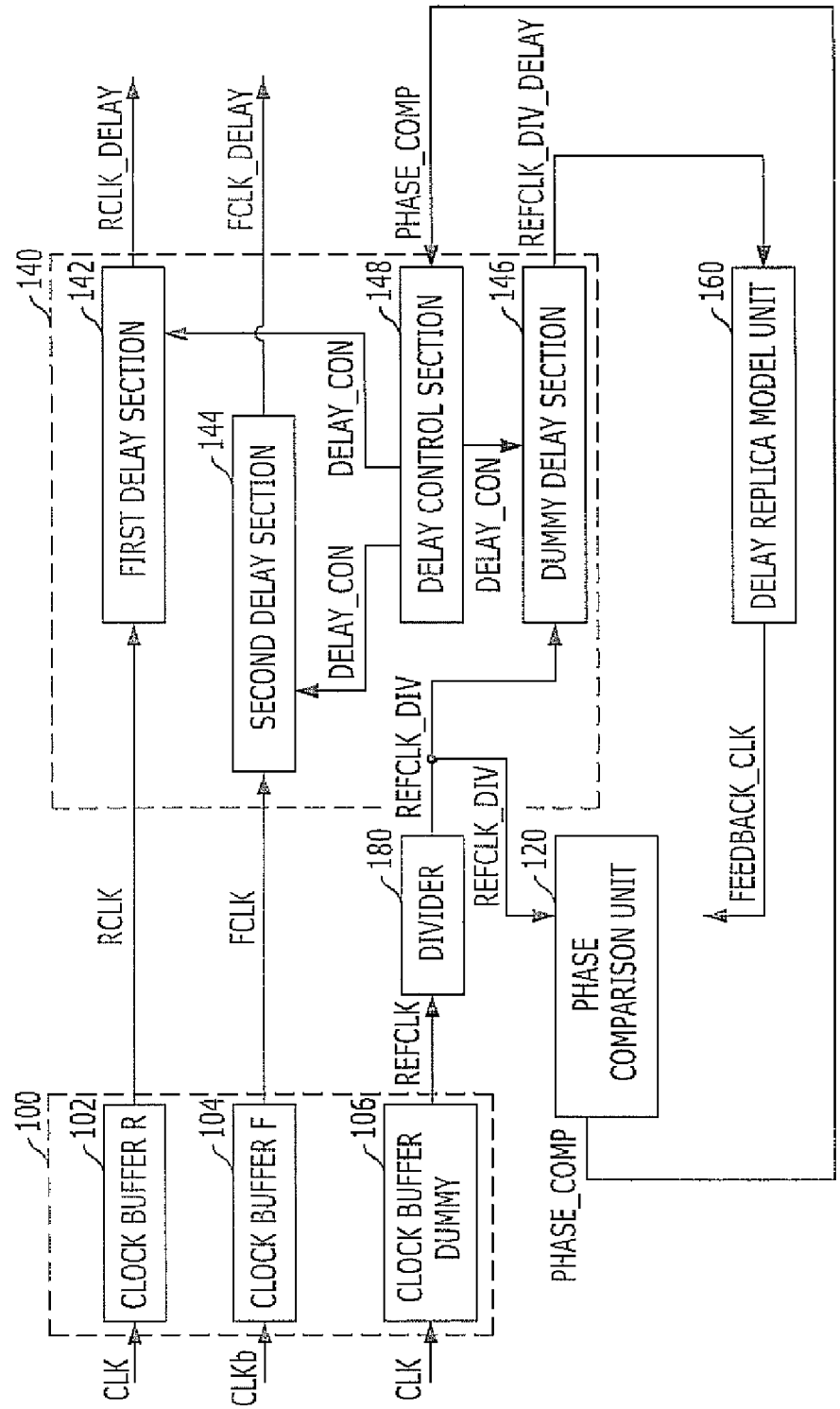
FIG. 1 is a block diagram illustrating the configuration of a known register controlled DLL circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
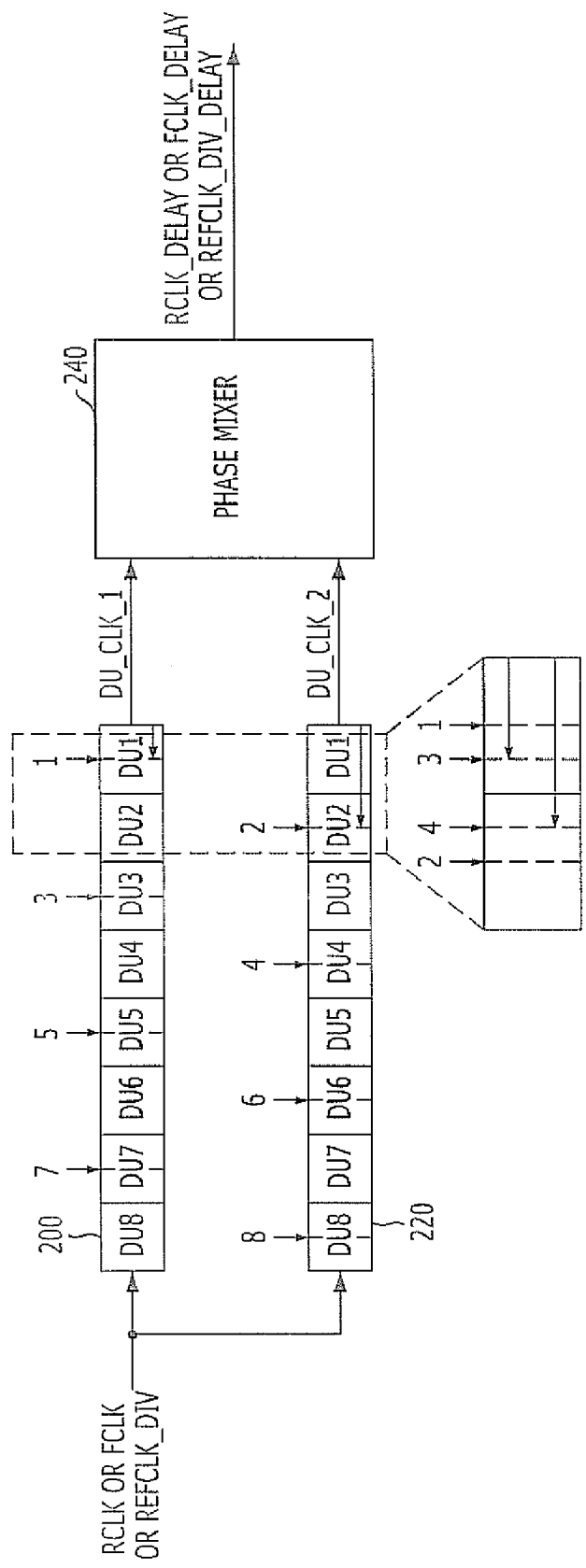
FIG. 2 is a block diagram illustrating a delay section of the clock delay unit in the known register controlled DLL circuit of FIG. 1.
Figure 3:
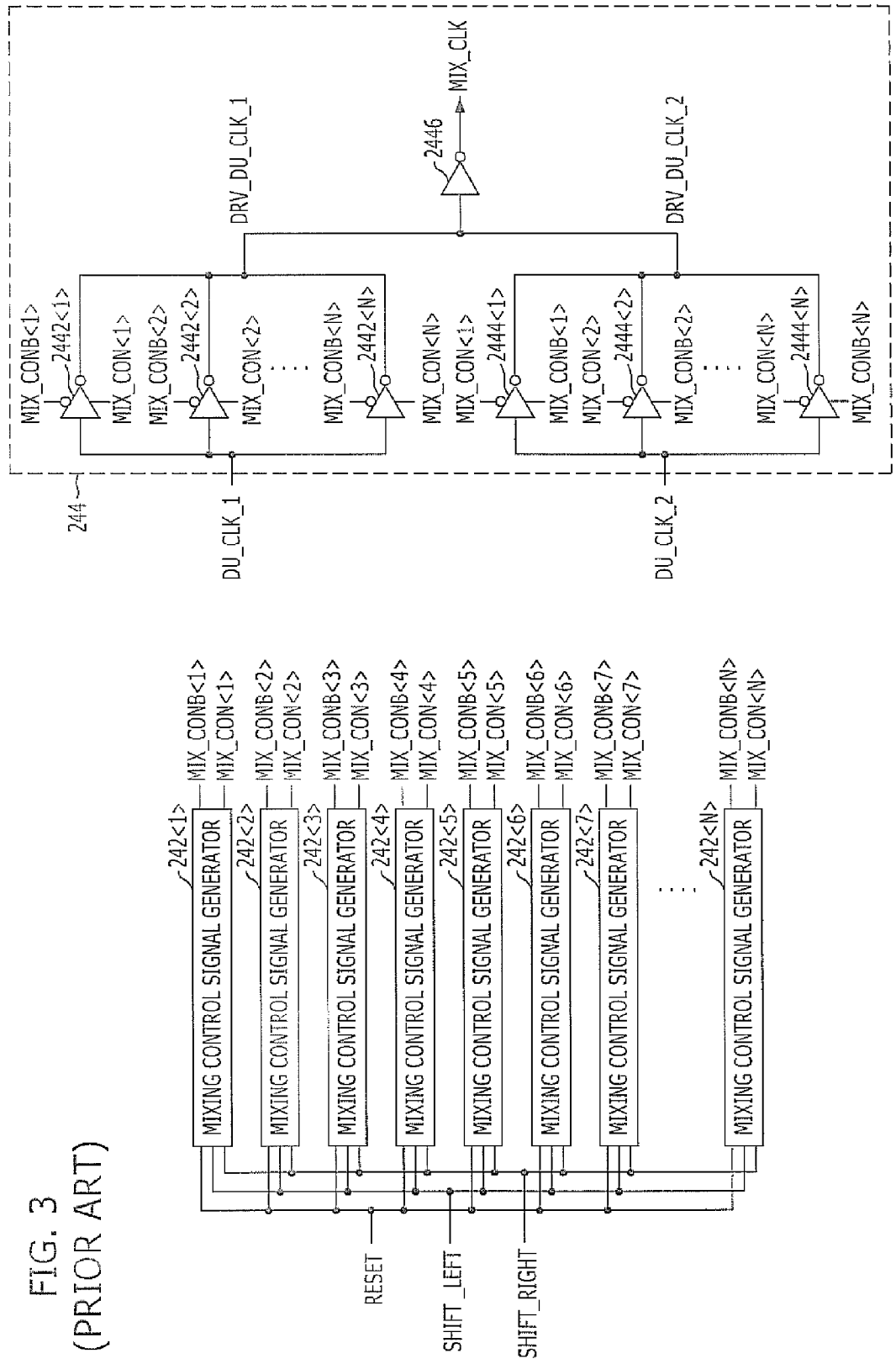
FIG. 3 is a block diagram illustrating a known phase mixer among the elements of the delay section of FIG. 2.
Figure 4:
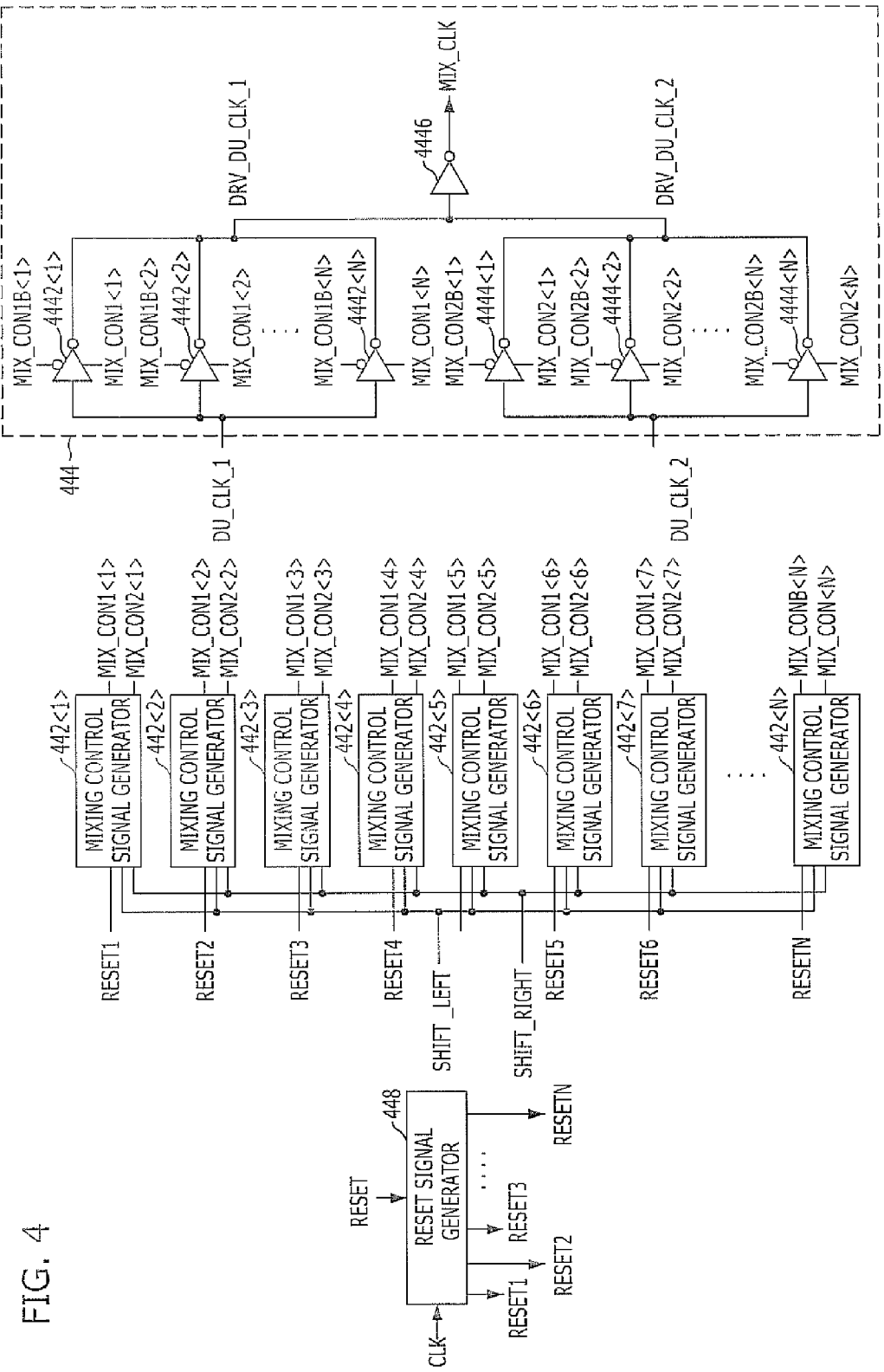
FIG. 4 is a block diagram illustrating a phase mixer among the elements of the delay section of FIG. 2 in accordance with an exemplary embodiment of the present invention.

FIG. 4 is a block diagram illustrating a phase mixer among the elements of the delay section of FIG. 2 in accordance with an exemplary embodiment of the present invention.

Referring to FIG. 4, the phase mixer 440 in accordance with an exemplary embodiment of the present invention includes a reset signal generator 448, a plurality of mixing control signal generators 442<1>, 442<2>, 442<3>, ..., 442<N>, and a clock mixer 444. The reset signal generator 448 is configured to change the number of signals activated among a plurality of reset signals RESET1, RESET2, RESET3, ..., RESETN according to frequencies of source clocks CLK and CLKB applied from the outside. The plurality of mixing control signal generators 442<1>, 442<2>, 442<3>, ..., 442<N> are configured to generate a plurality of first mixing control signals MIX_CON1<1>, MIX_CON1<2>, MIX_CON1<3>, ..., MIX_CON1<N> and a plurality of second mixing control signals MIX_CON2<1>, MIX_CON2<2>, MIX_CON2<3>, ..., MIX_CON2<N>. At this time, M number of the first mixing control signals MIX_CON1<1>, MIX_CON1<2>, MIX_CON1<3>, ..., MIX_CON1<M> and M number of the second mixing control signals MIX_CON2<1>, MIX_CON2<2>, MIX_CON2<3>, ..., MIX_CON2<M>, which correspond to signals activated among a plurality of reset signals RESET1, RESET2, RESET3, ..., RESTN, have opposite levels. R number of the first mixing control signals MIX_CON1<1>, MIX_CON1<2>, MIX_CON1<3>, ..., MIX_CON1<R> and R number of the second mixing control signals MIX_CON2<1>, MIX_CON2<2>, MIX_CON2<3>, ..., MIX_CON2<R>, which correspond to signals deactivated among the plurality of reset signals RESET1, RESET2, RESET3, ..., RESTN, have the same level. The clock mixer 444 is configured to generate a mixing clock MIX_CLK by mixing a first driving clock DRV_DU_CLK_1 and a second driving clock DRV_DU_CLK_2. The first driving clock DRV_DU_CLK_1 is generated by driving a clock DU_CLK_1 outputted from a first delay line 200 according to the plurality of first mixing control signals MIX_CON1<1>, MIX_CON1<2>, MIX_CON1<3>, ..., MIX_CON1<N>. The second driving clock DRV_DU_CLK_2 is generated by driving a clock DU_CLK_2 outputted from a second delay line 220 according to the plurality of second mixing control signals MIX_CON2<1>, MIX_CON2<2>, MIX_CON2<3>, ..., MIX_CON2<N>.

The clock mixer 444 includes a plurality of first drivers 4442<1>, 4442<2>, 4442<3>, ..., 4442<N>, a plurality of second drivers 4444<1>, 4444<2>, 4444<3>, ..., 4444<N>, and a clock combiner 4446. The plurality of first drivers 4442<1>, 4442<2>, 4442<3>, ..., 4442<N> are configured to output the first driving clock DRV_DU_CLK_1 by driving and combining the clock DU_CLK_1 outputted from the first delay line 200 in response to the plurality of first mixing control signals MIX_CON1<1>, MIX_CON1<2>, MIX_CON1<3>, ..., MIX_CON1<N>. The plurality of second drivers 4444<1>, 4444<2>, 4444<3>, ..., 4444<N> are configured to output the second driving clock DRV_DU_CLK_2 by driving and combining the clock DU_CLK_2 outputted from the second delay line 220 in response to the plurality of second mixing control signals MIX_CON2<1>, MIX_CON2<2>, MIX_CON2<3>, ..., MIX_CON2<N>. The clock combiner 4446 is configured to output the mixing clock MIX_CLK by combining the first driving clock DRV_DU_CLK_1 and the second driving clock DRV_DU_CLK_2.

Also, the plurality of first drivers 4442<1>, 4442<2>, 4442<3>, ..., 4442<N> may have different driving powers. Likewise, the plurality of second drivers 4444<1>, 4444<2>, 4444<3>, ..., 4444<N> may have different driving powers.

For reference, in the plurality of reset signals RESET1, RESET2, RESET3, ..., RESETN, the plurality of first mixing control signals MIX_CON1<1>, MIX_CON1<2>, MIX_CON1<3>, ..., MIX_CON1<N>, and the plurality of second mixing control signals MIX_CON2<1>, MIX_CON2<2>, MIX_CON2<3>, ..., MIX_CON2<N>, the term "plurality" is expressed by "N," where "N" is an integer greater than 1. Also, the plurality of first mixing control signals MIX_CON1<1>, MIX_CON1<2>, MIX_CON1<3>, ..., MIX_CON1<N> include the M number of the first mixing control signals MIX_CON1<1>, MIX_CON1<2>, MIX_CON1<3>, ..., MIX_CON1<M> and the R number of the first mixing control signals MIX_CON1<1>, MIX_CON1<2>, MIX_CON1<3>, ..., MIX_CON1<R>. Likewise, the plurality of second mixing control signals MIX_CON2<1>, MIX_CON2<2>, MIX_CON2<3>, ..., MIX_CON2<N> include the M number of the second mixing control signals MIX_CON2<1>, MIX_CON2<2>, MIX_CON2<3>, ..., MIX_CON2<M> and the R number of the second mixing control signals MIX_CON2<1>, MIX_CON2<2>, MIX_CON2<3>, ..., MIX_CON2<R>. Thus, N=M+R, where "M" and "R" are integers greater than or equal to 0.

From the relationship of "N", "M" and "R", where "N" is fixed, it can be deduced that if "M" increases, "R" decreases; and if "M" decreases, "R" increases. For more clarity, it will be described below that the plurality of first mixing control signals MIX_CON1<1>, MIX_CON1<2>, MIX_CON1<3>, ..., MIX_CON1<N> include the M number of the first mixing control signals MIX_CON1<1>, MIX_CON1<2>, MIX_CON1<3>, ..., MIX_CON1<M> and the (N−M) number of the first mixing control signals MIX_CON1<M+1>, MIX_CON1<M+2>, MIX_CON1<M+3>, ..., MIX_CON1<N>, and the plurality of second mixing control signals MIX_CON2<1>, MIX_CON2<2>, MIX_CON2<3>, ..., MIX_CON2<N> include the M number of the second mixing control signals MIX_CON2<1>, MIX_CON2<2>, MIX_CON2<3>, ..., MIX_CON2<M> and the (N−M) number of the second mixing control signals MIX_CON2<M+1>, MIX_CON2<M+2>, MIX_CON2<M+3>, ..., MIX_CON2<N>.

The operation of the phase mixer 440 in accordance with an exemplary embodiment of the present invention will be described by example below.

As the frequencies of the source clocks CLK and CLKB applied from the outside are higher, the reset signal generator 448 decreases the number of the signals activated among the plurality of reset signals RESET1, RESET2, RESET3, ..., RESETN. As the frequencies of the source clocks CLK and CLKB applied from the outside are lower, the reset signal generator 448 increases the number of the signals activated among the plurality of reset signals RESET1, RESET2, RESET3, ..., RESETN.

At this time, there are many methods which can determine whether the frequencies of the source clocks CLK and CLKB applied from the outside are high or low.

As exemplified in FIG. 4, when a CAS latency (CL) is larger, it may be determined that the frequencies of the source clocks CLK and CLKB applied from the outside are high. On the other hand, when a CAS latency (CL) is smaller, it may be determined that the frequencies of the source clocks CLK and CLKB applied from the outside are low.

That is, as the CAS latency is larger, the reset signal generator 448 decreases the number of the activated signals and increases the number of the deactivated signals among the plurality of reset signals RESET1, RESET2, RESET3, ..., RESETN. On the other hand, as the CAS latency is smaller, the reset signal generator 448 increases the number of the activated signals and decreases the number of the deactivated signals among the plurality of reset signals RESET1, RESET2, RESET3, ..., RESETN.

Although not illustrated in FIG. 4, a clock frequency detector configured to detect the frequencies of the source clocks CLK and CLKB applied from the outside may be further provided to determine whether the frequencies are high or low.

Likewise, although not illustrated in FIG. 4, whether the frequencies are high or low may be determined by receiving frequency information signals of the external source clocks CLK and CLKB directly from the outside. The frequency information signals of the source clocks CLK and CLKB may be replaced with test signals.

For reference, the increase in the number of the activated signals and the decrease in the number of the deactivated signals are based on the assumption that the total number of the reset signals RESET1, RESET2, RESET3, ..., RESETN has already been determined. That is, when the number of the reset signals RESET1, RESET2, RESET3, ..., RESETN is N and the number of the activated signals is M, the number of the deactivated signals is determined to be N−M. Therefore, as the number of the activated signals among the plurality of reset signals RESET1, RESET2, RESET3, ..., RESETN increases, the number of the deactivated signals decreases proportionally. On the other hand, as the number of the activated signals among the plurality of reset signals RESET1, RESET2, RESET3, ..., RESETN decreases, the number of the deactivated signals increases proportionally.

The order of activation of the reset signals RESET1, RESET2, RESET3, ..., RESETN is randomly determined according to the frequencies of the source clocks CLK and CLKB applied from the outside. That is, even though the number of the activated signals among the plurality of reset signals RESET1, RESET2, RESET3, ..., RESETN increases, the signals are not sequentially activated from the first reset signal RESET1 to the Nth reset signal RESETN. The signals may be randomly activated in a way that the fifth reset signal RESET5 is activated earlier than the first reset signal RESET1. The order of activation of the reset signals RESET1, RESET2, RESET3, ..., RESETN may be changed according to the frequencies of the source clocks CLK and CLKB, or may be previously determined by the designer.

When the signal applied among the plurality of reset signals RESET1, RESET2, RESET3, ..., RESETN is in a deactivated state, each of the mixing control signal generators 442<1>, 442<2>, 442<3>, ..., 442<N> activates one of the first mixing control signals MIX_CON1<1>, MIX_CON1<2>, MIX_CON1<3>, ..., MIX_CON1<N> and the second mixing control signals MIX_CON2<1>, MIX_CON2<2>, MIX_CON2<3>, ..., MIX_CON2<N> and deactivates the remaining signals in response to the mixing ratio control signals SHIFT_LEFT and SHIFT_RIGHT.

For example, when the third reset signal RESET3 applied to the third mixing control signal generator 442<3> among the plurality of mixing control signal generators 442<1>, 442<2>, 442<3>, ..., 442<N> is in an activated state, the third signal MIX_CON1<3> of the first mixing control signals outputted from the third mixing control signal generator 442<3> is activated and the third signal MIX_CON2<3> of the second mixing control signals is deactivated, or the third signal MIX_CON1<3> of the first mixing control signals is deactivated and the third signal MIX_CON2<3> of the second mixing control signal is activated.

On the other hand, when the signal applied among the plurality of reset signals RESET1, RESET2, RESET3, ..., RESETN is in an activated state, the first mixing control signals MIX_CON1<1>, MIX_CON1<2>, MIX_CON1<3>, ..., MIX_CON1<N> and the second mixing control signals MIX_CON2<1>, MIX_CON2<2>, MIX_CON2<3>, ..., MIX_CON2<N> are all activated or deactivated, regardless of the mixing ratio control signals SHIFT_LEFT and SHIFT_RIGHT.

For example, when the third reset signal RESET3 applied to the third mixing control signal generator 442<3> among the plurality of mixing control signal generators 442<1>, 442<2>, 442<3>, ..., 442<N> is in a deactivated state, both of the third signal MIX_CON1<3> of the first mixing control signals and the third signal MIX_CON2<3> of the second mixing control signals outputted from the third mixing control signal generator 442<3> may be activated or deactivated.

Among the plurality of first drivers 4442<1>, 4442<2>, 4442<3>, ..., 4442<N>, the (N−K) number (where "K" is an integer greater than or equal to 0) of the first drivers 4442<K+1>, 4442<K+2>, 4442<K+3>, ..., 4442<N−K> to which the first mixing control signals MIX_CON1<K+1>, MIX_CON1<K+2>, MIX_CON1<K+3>, ..., MIX_CON1<N−K> of the deactivated state are applied do not perform the driving operation. However, the K number of the first drivers 4442<1>, 4442<2>, 4442<3>, ..., 4442<K> to which the first mixing control signals MIX_CON1<1>, MIX_CON1<2>, MIX_CON1<3>, ..., MIX_CON1<K> of the activated state are applied do perform the driving operation.

Likewise, among the plurality of second drivers 4444<1>, 4444<2>, 4444<3>, ..., 4444<N>, the (N−L) number (where "L" is an integer greater than or equal to 0) of the second drivers 4444<L+1>, 4444<L+2>, 4444<L+3>, ..., 4444<N−L> to which the second mixing control signals MIX_CON2<L+1>, MIX_CON2<L+2>, MIX_CON2<L+3>, ..., MIX_CON2<N−L> of the deactivated state are applied do not perform the driving operation. However, the L number of the second drivers 4444<1>, 4444<2>, 4444<3>, ..., 4444<L> to which the second mixing control signals MIX_CON2<1>, MIX_CON2<2>, MIX_CON2<3>, ..., MIX_CON2<L> of the activated state are applied do perform the driving operation.

When the first mixing control signals MIX_CON1<1>, MIX_CON1<2>, MIX_CON1<3>, ..., MIX_CON1<K> and the second mixing control signals MIX_CON2<1>, MIX_CON2<2>, MIX_CON2<3>, ..., MIX_CON2<N> outputted from the plurality of mixing control signal generators 442<1>, 442<2>, 442<3>, ..., 442<N> in response to the activation of the plurality of reset signals RESET1, RESET2, RESET3, ..., RESETN are all deactivated, the K number of the first drivers 4442<1>, 4442<2>, 4442<3>, ..., 4442<K> which perform the driving operation among the plurality of first drivers 4442<1>, 4442<2>, 4442<3>, ..., 4442<N> correspond to the (N−L) number of the second drivers 4444<1>, 4444<2>, 4444<3>, ..., 4444<N−L> which do not perform the driving operation among the plurality of second drivers 4444<1>, 4444<2>, 4444<3>, ..., 4444<N>.

Likewise, the L number of the second drivers 4444<1>, 4444<2>, 4444<3>, ..., 4444<L> which perform the driving operation among the plurality of second drivers 4444<1>, 4444<2>, 4444<3>, ..., 4444<N> correspond to the (N−K) number of the first drivers 4442<K+1>, 4442<K+2>, 4442<K+3>, ..., 4442<N−K> which do not perform the driving operation among the plurality of first drivers 4442<1>, 4442<2>, 4442<3>, ..., 4442<N>.

The reason why the plurality of first drivers 4442<1>, 4442<2>, 4442<3>, ..., 4442<N> and the plurality of second drivers 4444<1>, 4444<2>, 4444<3>, ..., 4444<N> are driven is that the first mixing control signals MIX_CON1<1>, MIX_CON1<2>, MIX_CON1<3>, ..., MIX_CON1<N> and the second mixing control signals MIX_CON2<1>, MIX_CON2<2>, MIX_CON2<3>, ..., MIX_CON2<N> have opposite logic levels, respectively, or are all deactivated.

For example, it is assumed that the plurality of first mixing control signals MIX_CON1<1>, MIX_CON1<2>, MIX_CON1<3>, ..., MIX_CON1<N> are composed of ten signals (i.e., it is assumed N=10), four of the first mixing control signals MIX_CON1<1>, MIX_CON1<3>, MIX_CON1<4> and MIX_CON1<7> are activated, and six of the first mixing control signals MIX_CON1<2>, MIX_CON1<5>, MIX_CON1<6>, MIX_CON1<8>, MIX_CON1<9> and MIX_CON1<10> are deactivated. Given this assumption, among the ten first drivers 4442<1>, 4442<2>, 4442<3>, 4442<4>, 4442<5>, 4442<6>, 4442<7>, 4442<8>, 4442<9> and 4442<10>, the first, third, fourth and seventh drivers 4442<1>, 4442<3>, 4442<4> and 4442<7> perform the driving operation, and the second, fifth, sixth, eighth to tenth drivers 4442<2>, 4442<5>, 4442<6>, 4442<8>, 4442<9> and 4442<10> do not perform the driving operation.

Likewise, it is assumed that the plurality of second mixing control signals MIX_CON2<1>, MIX_CON2<2>, MIX_CON2<3>, ..., MIX_CON2<N> are composed of ten signals, four of the second mixing control signals MIX_CON2<2>, MIX_CON2<5>, MIX_CON2<8> and MIX_CON2<10> are activated, and six of the second mixing control signals MIX_CON2<1>, MIX_CON2<3>, MIX_CON2<4>, MIX_CON2<6>, MIX_CON2<7> and MIX_CON2<9> are deactivated. Given this assumption, among the ten second drivers 4444<1>, 4444<2>, 4444<3>, 4444<4>, 4444<5>, 4444<6>, 4444<7>, 4444<8>, 4444<9> and 4444<10>, the second, fifth, eighth and tenth drivers 4444<2>, 4444<5>, 4444<8> and 4444<10> perform the driving operation, and the first, third, fourth, sixth, seventh and ninth drivers 4444<1>, 4444<3>, 4444<4>, 4444<6>, 4444<7> and 4444<9> do not perform the driving operation.

As exemplified above, the four activated signals MIX_CON1<1>, MIX_CON1<3>, MIX_CON1<4> and MIX_CON1<7> among the plurality of first mixing control signals MIX_CON1<1>, MIX_CON1<2>, MIX_CON1<3>, ..., MIX_CON1<N> correspond to the six deactivated signals MIX_CON2<1>, MIX_CON2<3>, MIX_CON2<4>, MIX_CON2<6>, MIX_CON2<7> and MIX_CON2<9> among the plurality of second mixing control signals MIX_CON2<1>, MIX_CON2<2>, MIX_CON2<3>, ..., MIX_CON2<N>.

Likewise, the four activated signals MIX_CON2<2>, MIX_CON2<5>, MIX_CON2<8> and MIX_CON2<10> among the plurality of second mixing control signals MIX_CON2<1>, MIX_CON2<2>, MIX_CON2<3>, ..., MIX_CON2<N> correspond to the six deactivated signals MIX_CON1<2>, MIX_CON1<5>, MIX_CON1<6>, MIX_CON1<8>, MIX_CON1<9> and MIX_CON1<10> among the plurality of first mixing control signals MIX_CON1<1>, MIX_CON1<2>, MIX_CON1<3>, ..., MIX_CON1<N>.

The reason why the signals MIX_CON1<6> and MIX_CON1<9> are deactivated among the plurality of first mixing control signals MIX_CON1<1>, CON1<2>, CON1<3>, ..., MIX_CON1<N> and the signals MIX_CON2<6> and MIX_CON2<7> are deactivated among the plurality of second mixing control signals MIX_CON2<1>, MIX_CON2<2>, MIX_CON2<3>, ..., MIX_CON2<N> is due to the reset signals RESET6 and RESET9.

When the first mixing control signals MIX_CON1<1>, MIX_CON1<2>, MIX_CON1<3>, ..., MIX_CON1<K> and the second mixing control signals MIX_CON2<1>, MIX_CON2<2>, MIX_CON2<3>, ..., MIX_CON2<N> outputted from the plurality of mixing control signal generators 442<1>, 442<2>, 442<3>, ..., 442<N> in response to the activation of the plurality of reset signals RESET1, RESET2, RESET3, ..., RESETN are all activated, some of the K number of the first drivers 4442<1>, 4442<2>, 4442<3>, ..., 4442<K> which perform the driving operation among the plurality of first drivers 4442<1>, 4442<2>, 4442<3>, ..., 4442<N> correspond to the L number of the second drivers 4444<1>, 4444<2>, 4444<3>, ..., 4444<L> which perform the driving operation among the plurality of second drivers 4444<1>, 4444<2>, 4444<3>, ..., 4444<N>.

The reason why the plurality of first drivers 4442<1>, 4442<2>, 4442<3>, ..., 4442<N> and the plurality of second drivers 4444<1>, 4444<2>, 4444<3>, ..., 4444<N> are driven is that the first mixing control signals MIX_CON1<1>, MIX_CON1<2>, MIX_CON1<3>, ..., MIX_CON1<N> and the second mixing control signals MIX_CON2<1>, MIX_CON2<2>, MIX_CON2<3>, ..., MIX_CON2<N> have opposite logic levels, respectively, or are all deactivated.

Figure 5:
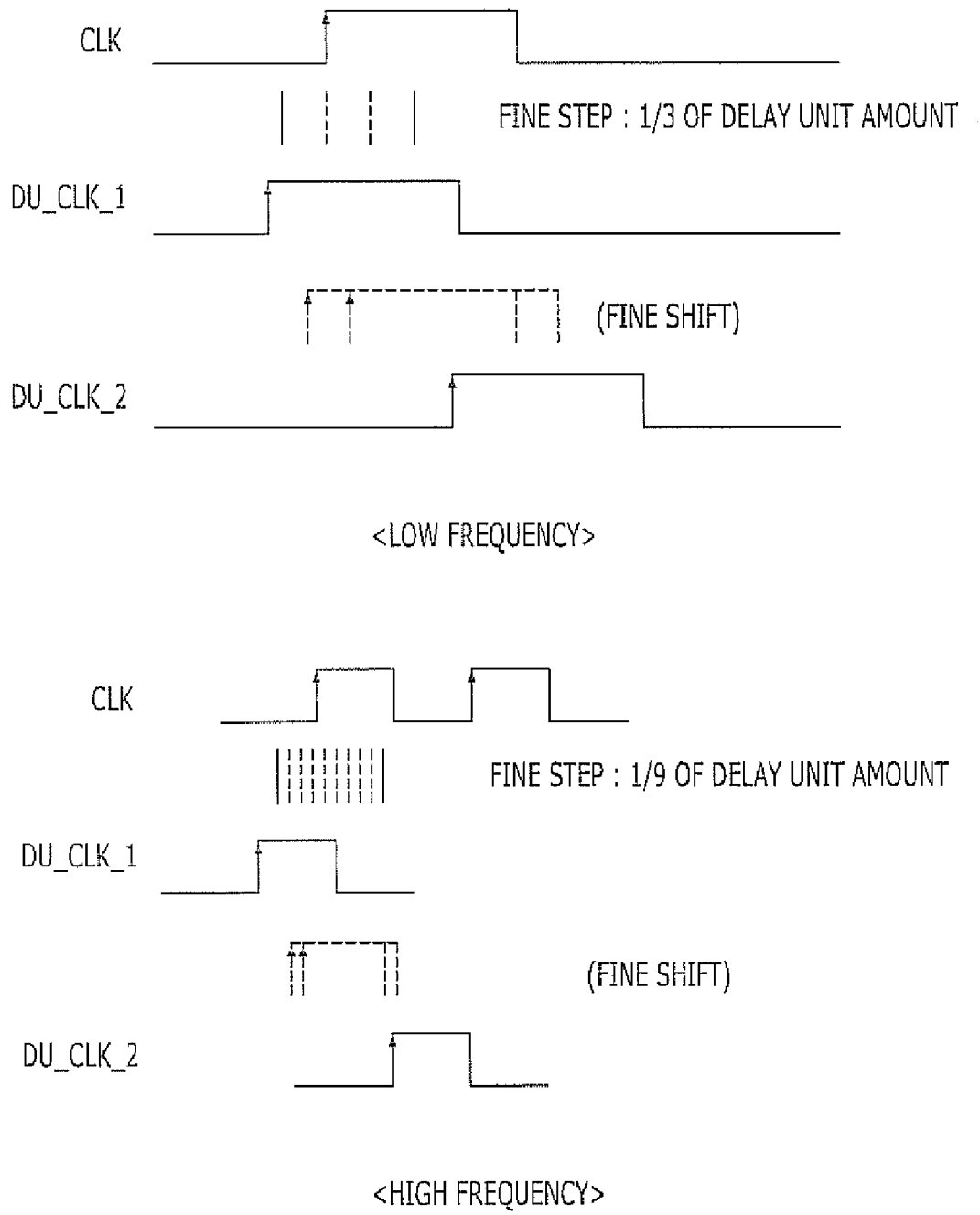
FIG. 5 is a diagram explaining the operation of the phase mixer in accordance with an exemplary embodiment of the present invention.

FIG. 5 is a diagram explaining the operation of the phase mixer in accordance with an exemplary embodiment of the present invention.

Referring to FIG. 5, the phase mixer 440 in accordance with an exemplary embodiment of the present invention operates in both a case in which a frequency is low and a case in which a frequency is high.

In the case where the frequency is low, it can be seen that the external source clock CLK, the clock DU_CLK_1 outputted from the first delay line 200, and the clock DU_CLK_2 outputted from the second delay line 220 are clocks having a relatively long activation period and deactivation period.

Accordingly, it can be recognized that the synchronization is achieved even though there is some difference between the rising edge of the mixing clock MIX_CLK, which is generated by mixing the phase of the clock DU_CLK_1 outputted from the first delay line 200 and the phase of the clock DU_CLK_2 outputted from the second delay line 220, and the rising edge of the source clock CLK.

Therefore, the phase mixer 440 in accordance with an exemplary embodiment of the present invention operates to shift the mixing clock MIX_CLK by a relatively large amount in the time elapsing between the rising edge of the clock DU_CLK_1 outputted from the first delay line 200 and the rising edge of the clock DU_CLK_2 outputted from the second delay line 220.

For example, the phase mixer 440 in accordance with an exemplary embodiment of the present invention operates to shift the mixing clock MIX_CLK by ⅓×delay unit amount in the time elapsing between the rising edge of the clock DU_CLK_1 outputted from the first delay line 200 and the rising edge of the clock DU_CLK_2 outputted from the second delay line 220.

The above-described operation can be performed by the phase mixer 440 in accordance with an exemplary embodiment of the present invention, because the number of the first drivers 4442<1>, 4442<2>, 4442<3>, ..., 4442<N> which can drive the clock DU_CLK_1 outputted from the first delay line 200 and the number of the second drivers 4444<1>, 4444<2>, 4444<3>, ..., 4444<N> which can drive the clock DU_CLK_2 outputted from the second delay line 220 can be limited to 3 (a total number of first and second drivers is 6).

That is, three reset signals among the plurality of reset signals RESET1, RESET2, RESET3, ..., RESETN may be deactivated, while the remaining signals may be activated. Thus, among the plurality of first mixing control signals MIX_CON1<1>, MIX_CON1<2>, MIX_CON1<3>, ..., MIX_CON1<N> and the plurality of second mixing control signals MIX_CON2<1>, MIX_CON2<2>, MIX_CON2<3>, ..., MIX_CON2<N>, the respective three signals of the first mixing control signals MIX_CON1<1>, MIX_CON1<2>, MIX_CON1<3>, ..., MIX_CON1<N> have the opposite logic levels with their corresponding three signals of the second mixing control signals MIX_CON2<1>, MIX_CON2<2>, MIX_CON2<3>, ..., MIX_CON2<N>, and the remaining signals are all deactivated. Through such a control, the number of the drivers capable of performing the driving operation can be limited to 3 among the plurality of first drivers 4442<1>, 4442<2>, 4442<3>, ..., 4442<N> and 3 among the plurality of second drivers 4444<1>, 4444<2>, 4444<3>, ..., 4444<N>.

In the case where the frequency is high, it can be seen that the external source clock CLK, the clock DU_CLK_1 outputted from the first delay line 200, and the clock DU_CLK_2 outputted from the second delay line 220 are clocks having a relatively short activation period and deactivation period.

Accordingly, it is recognized that the synchronization is not achieved if the rising edge of the mixing clock MIX_CLK, which is generated by mixing the phase of the clock DU_CLK_1 outputted from the first delay line 200 and the phase of the clock DU_CLK_2 outputted from the second delay line 220, is not exactly matched with the rising edge of the source clock CLK.

Therefore, the phase mixer 440 in accordance with an exemplary embodiment of the present invention operates to shift the mixing clock MIX_CLK by a relatively small amount in the time elapsing between the rising edge of the clock DU_CLK_1 outputted from the first delay line 200 and the rising edge of the clock DU_CLK_2 outputted from the second delay line 220.

For example, the phase mixer 440 in accordance with an exemplary embodiment of the present invention operates to shift the mixing clock MIX_CLK by ⅑×delay unit amount in the time elapsing between the rising edge of the clock DU_CLK_1 outputted from the first delay line 200 and the rising edge of the clock DU_CLK_2 outputted from the second delay line 220.

The above-described operation can be performed by the phase mixer 440 in accordance with an exemplary embodiment of the present invention, because the number of the first drivers 4442<1>, 4442<2>, 4442<3>, ..., 4442<N> which can drive the clock DU_CLK_1 outputted from the first delay line 200 and the number of the second drivers 4444<1>, 4444<2>, 4444<3>, ..., 4444<N> which can drive the clock DU_CLK_2 outputted from the second delay line 220 can be limited to 9 (a total number of first and second drivers is 18).

As such, the phase mixer 440 in accordance with an exemplary embodiment of the present invention can adjust the number of the drivers used for driving the clock DU_CLK_1 outputted from the first delay line 200 and the clock DU_CLK_1 outputted from the second delay line 220 among the plurality of first drivers 4442<1>, 4442<2>, 4442<3>, ..., 4442<N> and the plurality of second drivers 4444<1>, 4444<2>, 4444<3>, ..., 4444<N> according to the frequencies of the external source clocks CLK and CLKB.

For reference, the above-described method of adjusting the number of the activated signals among the plurality of reset signals RESET1, RESET2, RESET3, ..., RESETN according to the frequencies of the external source clocks CLK and CLKB is merely exemplary for convenience of explanation. If the plurality of first drivers 4442<1>, 4442<2>, 4442<3>, ..., 4442<N> and the plurality of second drivers 4444<1>, 4444<2>, 4444<3>, ..., 4444<N> can be turned on/off according to the frequencies of the external source clocks CLK and CLKB, this will fall within the scope of the present invention even though the plurality of reset signals RESET1, RESET2, RESET3, ..., RESETN are directly controlled.

Furthermore, although the clock delay unit 140 included in the DLL circuit has been described in the foregoing embodiments, this is because the most representative circuit to which the exemplary embodiments of the present invention are applicable is the DLL circuit. It should be recognized that any circuit which mixes two clocks having a phase difference and uses the mixed clock will fall within the scope of the present invention.

In accordance with the exemplary embodiments of the present invention, the respective drivers for driving the positive source clock CLK and the negative source clock CLKB can be turned on/off according to the frequencies of the source clocks CLK and CLKB. Thus, the source clocks CLK and CLKB can be delayed by adjusting the delay amount variation range within the delay range narrower than the delay unit amount, even when the frequencies of the source clocks CLK and CLKB applied to the semiconductor device are changed to be higher or lower than the frequencies determined when designed.

Therefore, the DLL circuit can perform the DLL operation at the maximum performance, without any problem, even when the frequencies of the source clocks CLK and CLKB are changed to be higher or lower than the frequencies determined when designed.

In accordance with the exemplary embodiments of the present invention, the number of the drivers for driving the positive source clock CLK and the negative source clock CLKB can be changed according to the frequencies of the source clocks CLK and CLKB. Thus, the source clocks CLK and CLKB can be delayed by adjusting the delay amount variation range within the delay range narrower than the delay unit amount, even when the frequencies of the source clocks CLK and CLKB applied to the semiconductor device are changed to be higher or lower than the frequencies determined when designed.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
  a reset signal generator configured to change the number of activated signals among a plurality of reset signals according to a frequency of an external clock;
  a plurality of mixing control signal generators configured to generate a plurality of first and second mixing control signals, wherein M number of the first and second mixing control signals corresponding to the activated signals among the plurality of reset signals have opposite levels, and R number of the first and second mixing control signals corresponding to deactivated signals among the plurality of reset signals have the same level; and
  a clock mixer configured to generate a mixing clock by mixing a first driving clock and a second driving clock, wherein the first driving clock is generated by driving a positive clock of the external clock according to the plurality of first mixing control signals, and the second driving clock is generated by driving a negative clock of the external clock according to the plurality of second mixing control signals.

2. The semiconductor device of claim 1, wherein each of the plurality of mixing control signal generators activates one of the first and second mixing control signals and deactivates the remaining signals in response to a mixing ratio control signal when an applied signal among the plurality of reset signals is in an activated state, and each of the plurality of mixing control signal generators deactivates the first and second mixing control signals, regardless of the mixing ratio control signal, when the applied signal among the plurality of reset signals is in a deactivated state.

3. The semiconductor device of claim 2, wherein the clock mixer comprises:
  a plurality of first drivers configured to output the first driving clock by driving and combining the positive clock of the external clock in response to the plurality of first mixing control signals;
  a plurality of second drivers configured to output the second driving clock by driving and combining the negative clock of the external clock in response to the plurality of second mixing control signals; and
  a clock combiner configured to output the mixing clock by combining the first driving clock and the second driving clock.

4. The semiconductor device of claim 3, wherein the plurality of first drivers have different driving powers, and the plurality of second drivers have different driving powers.

5. The semiconductor device of claim 3, wherein one or more first drivers to which the first mixing control signals of the deactivated state are applied do not perform the driving operation,
  one or more first drivers to which the first mixing control signals of the activated state are applied perform the driving operation,
  one or more second drivers to which the second mixing control signals of the deactivated state are applied do not perform the driving operation, and
  one or more second drivers to which the second mixing control signals of the activated state are applied perform the driving operation.

6. The semiconductor device of claim 5, wherein the order of activation of the reset signals is randomly determined according to the frequency of the external clock.

7. The semiconductor device of claim 6, wherein the reset signal generator decreases the number of the reset signals that are activated as the frequency of the external clock increases, and increases the number of the reset signals that are activated as the frequency of the external clock decreases.

8. The semiconductor device of claim 6, wherein the reset signal generator decreases the number of the reset signals that are activated as a CAS latency increases, and increases the number of the reset signals that are activated as the CAS latency decreases.

9. A semiconductor device comprising:
- a plurality of first clock driving units configured to output a first driving clock by driving and combining a positive clock of an external clock, the first clock driving units being turned on/off according to a frequency of the external clock and having different driving powers;
- a plurality of second clock driving units configured to output a second driving clock by driving and combining a negative clock of the external clock, the second clock driving units being turned on/off according to the frequency of the external clock and having different driving powers; and
- a clock combiner configured to generate a mixing clock by combining the first driving clock and the second driving clock.

10. The semiconductor device of claim 9, wherein the number of the first clock driving units performing a driving operation coincides with the number of the second clock driving units performing a driving operation, the number of the first clock driving units enabled among the first clock driving units performing a driving operation coincides with the number of the second clock driving units disabled among the second clock driving units performing the a driving,
- the number of the first clock driving units disabled among the first clock driving units performing the a driving coincides with the number of the second clock driving units enabled among the second clock driving units performing the a driving, and
- the number of the first clock driving units not performing a driving operation coincides with the number of the second clock driving units not performing a driving operation.

11. The semiconductor device of claim 9, wherein the plurality of first clock driving units comprise M number of first clock driving units performing a driving operation, and R number of first clock driving units not performing a driving operation, the positive clock of the external clock is driven through the M number of first clock driving units performing the driving operation.

12. The semiconductor device of claim 11, wherein the plurality of second clock driving units comprise M number of second clock driving units performing a driving operation, and R number of second clock driving units not performing a driving operation, the negative clock of the external clock is driven through the M number of second clock driving units performing the driving operation.

13. The semiconductor device of claim 12, wherein a ratio of the number of the first and second clock driving units performing the driving operation to the number of the first and second clock driving units not performing the driving operation among the plurality of first and second clock driving units is randomly determined according to the frequency of the external clock.

14. The semiconductor device of claim 13, wherein, as the frequency of the external clock increases, the number of the first and second clock driving units performing the driving operation increases and the number of the first and second clock driving units not performing the driving operation decreases, and
- as the frequency of the external clock decreases, the number of the driving units performing the driving operation decreases and the number of the first and second clock driving units performing the driving operation increases.

15. The semiconductor device of claim 13, wherein, as a CAS latency increases, the number of the first and second clock driving units performing the driving operation increases and the number of the first and second clock driving units not performing the driving operation decreases, and
- as the CAS latency decreases, the number of the first and second clock driving units performing the driving operation decreases and the number of the first and second clock driving units not performing the driving operation increases.

* * * * *